(12) United States Patent
Yamazaki et al.

(10) Patent No.: US 12,068,171 B2
(45) Date of Patent: Aug. 20, 2024

(54) METHOD FOR ETCHING OXIDE SEMICONDUCTOR FILM AND PLASMA PROCESSING APPARATUS

(71) Applicant: TOKYO ELECTRON LIMITED, Tokyo (JP)

(72) Inventors: Masahiro Yamazaki, Miyagi (JP); Shigeru Tahara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 498 days.

(21) Appl. No.: 17/163,102

(22) Filed: Jan. 29, 2021

(65) Prior Publication Data

US 2021/0242036 A1 Aug. 5, 2021

(30) Foreign Application Priority Data

Feb. 3, 2020 (JP) .................... 2020-016587

(51) Int. Cl.
| | |
|---|---|
| *H01L 21/311* | (2006.01) |
| *H01J 37/32* | (2006.01) |
| *H01L 21/02* | (2006.01) |
| *H01L 21/3213* | (2006.01) |
| *H01L 21/465* | (2006.01) |
| *H01L 21/467* | (2006.01) |

(52) U.S. Cl.
CPC ...... *H01L 21/467* (2013.01); *H01J 37/32449* (2013.01); *H01J 37/32715* (2013.01); *H01L 21/02057* (2013.01); *H01L 21/32136* (2013.01); *H01L 21/465* (2013.01); *H01J 37/32238* (2013.01); *H01J 2237/334* (2013.01)

(58) Field of Classification Search
CPC .......... H01L 21/3065; H01L 21/31114; H01L 21/31116

See application file for complete search history.

(56) References Cited

U.S. PATENT DOCUMENTS

| | | | | |
|---|---|---|---|---|
| 5,667,631 A | * | 9/1997 | Holland | C04B 41/5346 216/13 |
| 2005/0079717 A1 | * | 4/2005 | Savas | F16B 35/04 438/689 |
| 2010/0301328 A1 | * | 12/2010 | Yamazaki | H01L 29/513 257/E21.04 |
| 2017/0269478 A1 | * | 9/2017 | Lin | G03F 7/38 |
| 2018/0342403 A1 | * | 11/2018 | Anthis | H01L 21/28194 |
| 2022/0122852 A1 | * | 4/2022 | Hirata | H01L 21/465 |

FOREIGN PATENT DOCUMENTS

| | | |
|---|---|---|
| JP | 2008-042067 A | 2/2008 |
| JP | 2018-125566 A | 8/2018 |

\* cited by examiner

*Primary Examiner* — Thomas T Pham
(74) *Attorney, Agent, or Firm* — XSENSUS LLP

(57) ABSTRACT

A method for etching an oxide semiconductor film includes: providing a substrate including a mask of a silicon-containing film on an oxide semiconductor film containing at least indium (In), gallium (Ga), and zinc (Zn); supplying a processing gas containing a bromine (Br)-containing gas or an iodine (I)-containing gas; and etching the oxide semiconductor film by plasma generated from the processing gas.

12 Claims, 10 Drawing Sheets

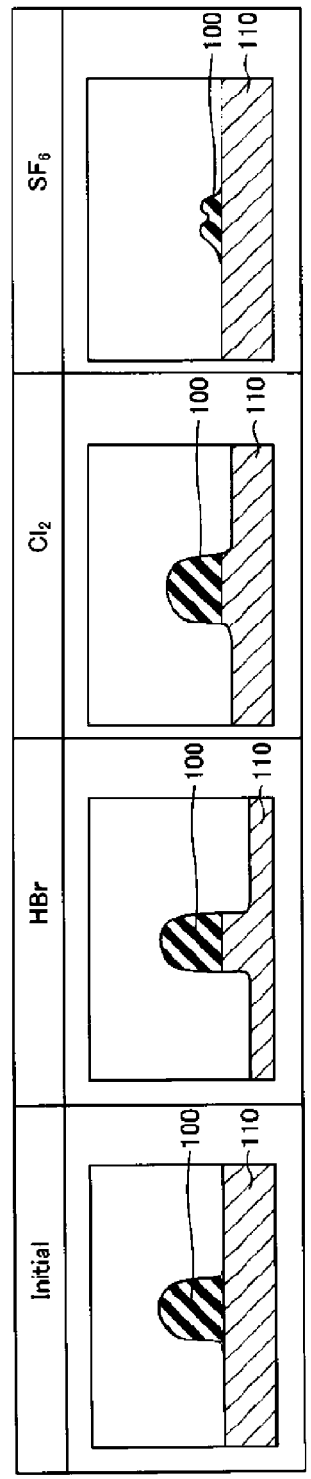

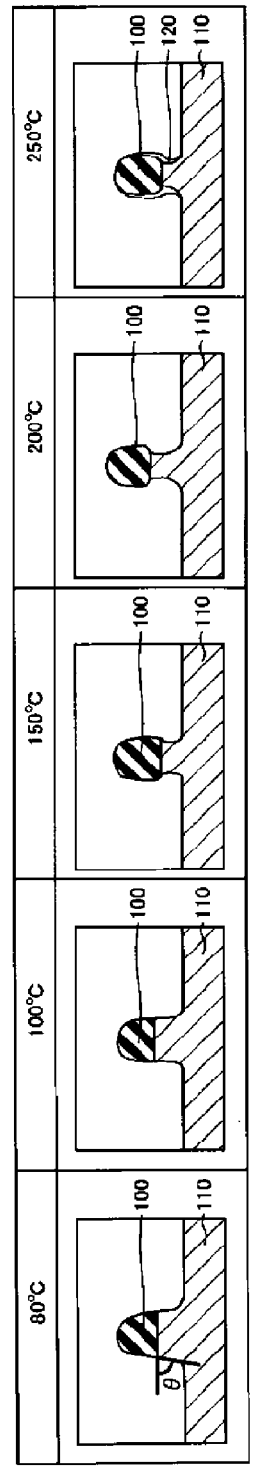

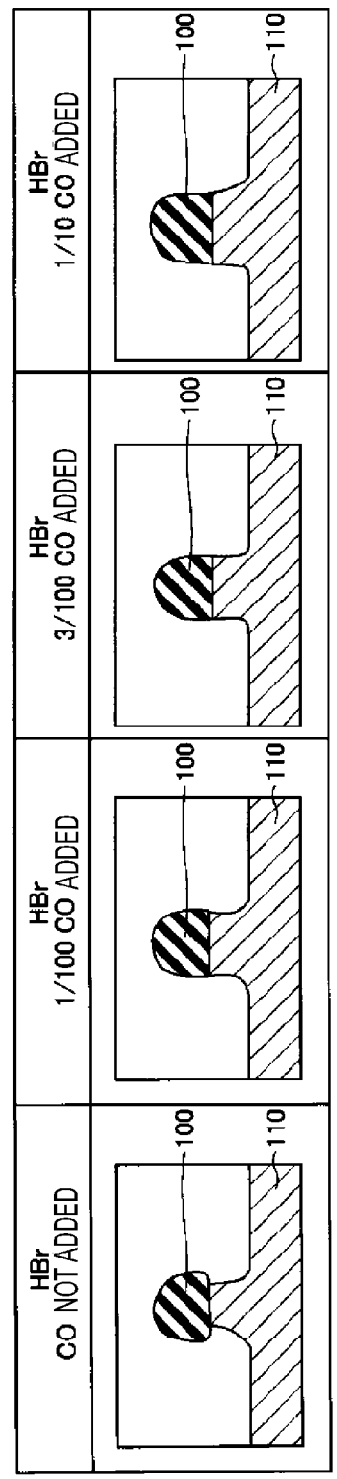

METHOD FOR ETCHING OXIDE SEMICONDUCTOR FILM AND PLASMA PROCESSING APPARATUS

CROSS-REFERENCE TO RELATED APPLICATIONS

This application is based on and claims priority from Japanese Patent Application No. 2020-016587 filed on Feb. 3, 2020 with the Japan Patent Office, the disclosure of which is incorporated herein in its entirety by reference.

TECHNICAL FIELD

The present disclosure relates to a method for etching an oxide semiconductor film and a plasma processing apparatus.

BACKGROUND

Japanese Laid-Open Patent Publication No. 2008-042067 proposes etching an oxide containing at least In, Ga, and Zn using a chlorine gas as an etching gas source. Further, Japanese Laid-Open Patent Publication No. 2008-042067 proposes that other sources may be used as long as the sources may generate radicals and ions of halogen elements.

SUMMARY

According to an aspect of the present disclosure, a method for etching an oxide semiconductor film is provided. The method includes: a step of providing a substrate including a mask of a silicon-containing film on an oxide semiconductor film containing at least indium (In), gallium (Ga), and zinc (Zn); a step of supplying a processing gas containing a bromine (Br)-containing gas or an iodine (I)-containing gas; and a step of etching the oxide semiconductor film by plasma generated from the processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A to 3D are views illustrating gas dependence in etching of an IGZO film according to the embodiment.

FIGS. 6A to 6E are views illustrating temperature dependence in etching of the IGZO film according to the embodiment.

FIGS. 8A to 8D are views illustrating an example of gas addition and shape controlling according to the embodiment.

DETAILED DESCRIPTION

Figure 1:
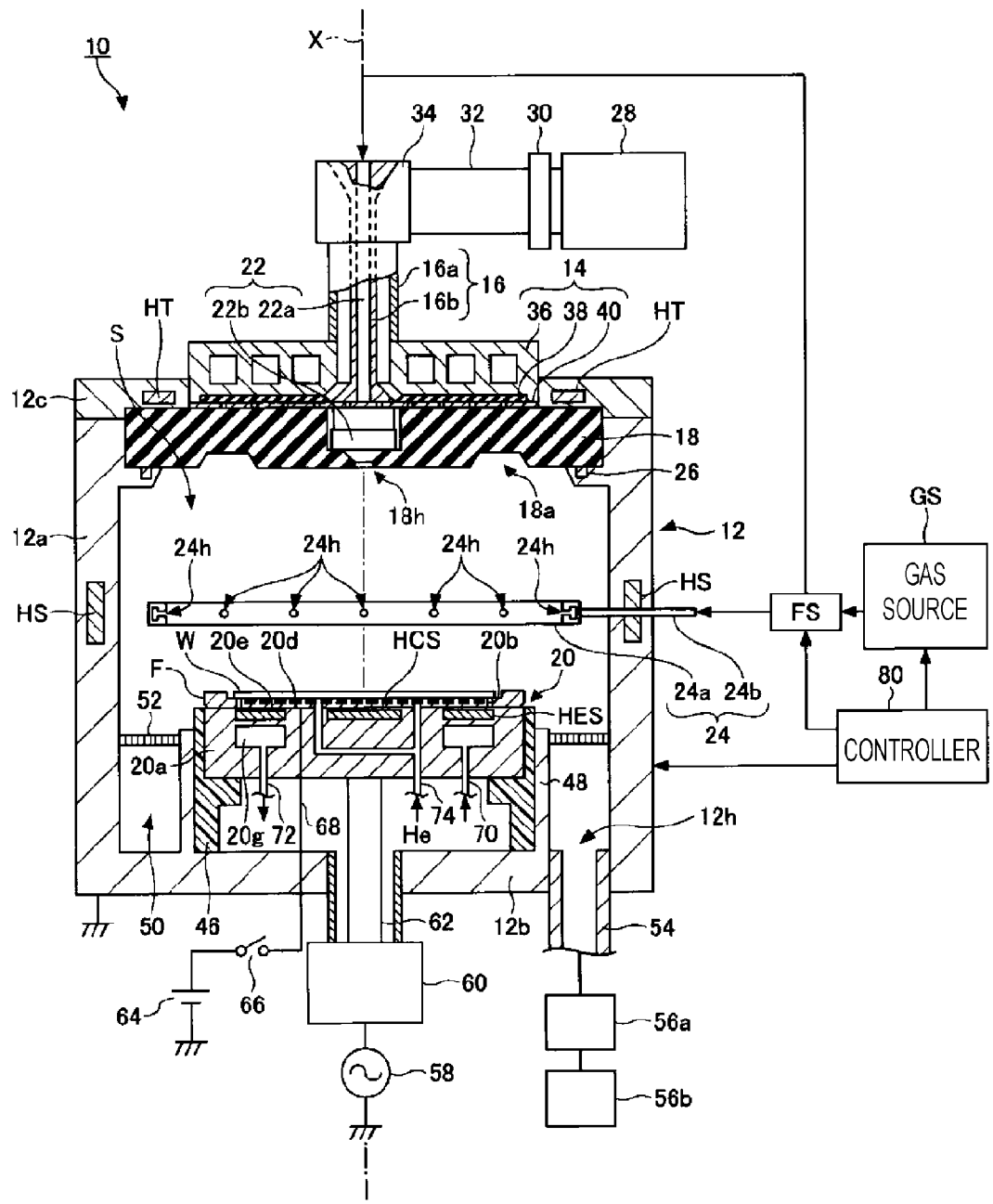
FIG. 1 is a schematic cross-sectional view illustrating an example of a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings. In each drawing, the same components may be denoted by the same reference numerals, and duplicate description may be omitted.

In a manufacturing processing of a semiconductor device, in response to the miniaturization for the purpose of further integration, a high mask selection ratio and a vertical shape at the time of etching are required. As a result, when an oxide semiconductor film, which is a base film, using a silicon oxide film ($SiO_2$) as a hard mask, it is important to appropriately select a processing gas (etching gas) having a good mask selection ratio and a vertical shape. The mask selection ratio refers to the ratio of the etching rate of the oxide semiconductor film to the etching rate of the silicon oxide film. As the mask selection ratio increases, the rate at which the oxide semiconductor film is etched is higher than that of the silicon oxide film.

In the following, descriptions will be first made on a configuration of a plasma processing apparatus 10 that executes a method for etching the oxide semiconductor film, and then, the method for etching the oxide semiconductor film and test results with respect to appropriateness of the processing gas.

[Configuration of Plasma Processing Apparatus]

FIG. 1 is a cross-sectional view illustrating an example of the plasma processing apparatus 10. The plasma processing apparatus 10 according to the example is a microwave plasma processing apparatus using a radial line slot antenna, and is used, for example, for forming a transistor.

For example, as illustrated in FIG. 1, the plasma processing apparatus 10 includes a chamber 12. The chamber 12 defines a processing space S configured to accommodate a semiconductor wafer (hereinafter, referred to as a "wafer W"), which is an example of a substrate. The chamber 12 includes a side wall 12a, a bottom wall 12b, and a ceiling wall 12c.

The sidewall 12a has a substantially tubular shape that extends in a direction in which an axis Z extends (hereinafter, referred to as an "axis Z direction"). The bottom wall 12b is provided at a lower end side of the side wall 12a. The bottom wall 12b includes an exhaust port 12h for exhaust. An upper end portion of the side wall 12a is opened. The opening of the upper end portion of the side wall 12a is closed by a dielectric window 18. The side wall 12a, the bottom wall 12b, and the ceiling wall 12c are made of a metal such as aluminum, and a sprayed film of, for example, $Y_2O_3$ (yttrium oxide) is formed on the surface thereof, and plasma resistance processing is executed thereon. The dielectric window 18 is interposed between the upper end portion of the side wall 12a and the ceiling wall 12c. A sealing member 26 may be interposed between the dielectric window 18 and the upper end portion of the side wall 12a. The sealing member 26 is, for example, an O-ring, and contributes to sealing of the chamber 12.

The plasma processing apparatus 10 includes a stage 20 provided in the chamber 12. The stage 20 is provided below the dielectric window 18. The stage 20 includes a base 20a and an electrostatic chuck 20b. The electrostatic chuck 20b is provided on the upper surface of the base 20a.

The base 20a is made of a metallic conductor material such as aluminum, and is supported by a support 46 extending vertically upward from the bottom wall 12b. A support 48 made of a conductive material is provided on the outer periphery of the support 46. The support 48 extends vertically upwardly from the bottom wall 12b of the chamber 12 along the outer periphery of the support 46. An annular exhaust path 50 is formed between the support 48 and the side wall 12a.

An annular baffle plate 52 provided with a plurality of through holes is provided to the upper portion of the exhaust path 50. The exhaust path 50 is connected to an exhaust pipe 54 via the exhaust port 12h. The exhaust pipe 54 is connected with an exhaust device 56b via a pressure adjustor 56a. The exhaust device 56b includes a vacuum pump such as, for example, a turbo molecular pump. The pressure adjustor 56a is a valve that adjusts the exhaust flow rate, for example, is an auto pressure controller (APC), and adjusts the exhaust amount of the exhaust device 56b to adjust the pressure in the chamber 12. The plasma generating space S in the chamber 12 is decompressed to a desired vacuum degree by the pressure adjustor 56a and the exhaust device 56b. Further, the processing gas is exhausted through the exhaust path 50 from the outer periphery of the stage 20 by the operation of the exhaust device 56b.

The base 20a also functions as a radio-frequency electrode. The base 20a is connected with a radio-frequency power source 58 for RF bias via a matcher 60 and a power feeding rod 62. The radio-frequency power source 58 supplies the RF bias power of a desired frequency, such as, 13.56 MHz to the base 20a, which is suitable for controlling the energy of ions drawn into the wafer W. The matcher 60 matches the impedance on the radio-frequency power source 58 side with the impedance on the load side such as the electrode, plasma, and the chamber 12. The matcher 60 includes a blocking capacitor for self-bias generation.

The upper surface of the electrostatic chuck 20b constitutes a placing area for placing the wafer W. The electrostatic chuck 20b holds the wafer W by an electrostatic attraction force. A focus ring F is provided diametrically outside the electrostatic chuck 20b to annularly surround the periphery of the wafer W. The electrostatic chuck 20b includes an electrode 20d made of a conductive film, and an insulating layer 20e made of a dielectric material, into which the electrode 20d is fitted. The electrode 20d is connected to a power source 64 through a switch 66 and a wire 68. The electrostatic chuck 20b attracts and holds the wafer W on the upper surface by the Coulomb force generated by the DC voltage applied from the poser source 64.

A plurality of annular coolant chambers 20g is provided inside the base 20a. In the coolant chamber 20g, a coolant of a desired temperature, for example, cooling water is circularly supplied through pipes 70 and 72 from a chiller unit. The processing temperature of the wafer W on the electrostatic chuck 20b may be controlled by the temperature of the coolant. Further, a heat transfer gas (e.g., He gas) supplied from a heat transfer gas supply (not illustrated) is supplied between the upper surface of the electrostatic chuck 20b and the rear surface of the wafer W through a gas supply pipe 74.

The plasma processing apparatus 10 may include heaters HT, HS, HCS, and HES as temperature control mechanisms. The heater HT is provided in the ceiling wall 12c, and extends annularly to surround an antenna 14. Further, the heater HS is provided inside the side wall 12a, and extends annularly. The heater HS may be provided, for example, at a position corresponding to in the middle of the height direction (i.e., axis X direction) of the processing space S. The heater HCS is provided inside the base 20a. The heater HCS is provided inside the base 20a below the central portion of the placing area described above, that is, in an area intersecting the axis X. Further, the heater HES is provided inside the base 20a, and extends annularly to surround the heater HCS. The heater HES is provided below the outer edge portion of the placing area described above.

The plasma processing apparatus 10 includes the antenna 14, a coaxial waveguide 16, the dielectric window 18, a microwave generator 28, a tuner 30, a waveguide 32, and a mode converter 34. The microwave generator 28 is connected to the upper portion of the coaxial waveguide 16 via the tuner 30, the waveguide 32, and the mode converter 34. The microwave generator 28 generates microwaves having a desired frequency of, for example, 2.45 GHz. The coaxial waveguide 16 extends along the axis X which is a central axis thereof. The coaxial waveguide 16 includes an outer conductor 16a and an inner conductor 16b. The outer conductor 16a has a tubular shape that extends in the axis X direction. The lower end of the outer conductor 16a is electrically connected to the upper portion of the cooling jacket 36 having a conductive surface. The inner conductor 16b is provided inside the outer conductor 16a. The inner conductor 28b extends along the axis X. The lower end of the inner conductor 16b is connected to a slot plate 40 of the antenna 14.

The antenna 14 is disposed within an opening formed in the ceiling wall 12c. The antenna 14 includes a dielectric plate 38, and a slot plate 40. The dielectric plate 38 shortens the wavelength of the microwaves, and has a substantially disc shape. The dielectric plate 38 is made of, for example, quartz or alumina. The dielectric plate 38 is interposed between the upper surface of the slot plate 40 and the lower surface of a cooling jacket 36. The antenna 14 may be constituted by the dielectric plate 38, the slot plate 40, and the cooling jacket 36 (substantially the lower surface thereof).

Figure 2:
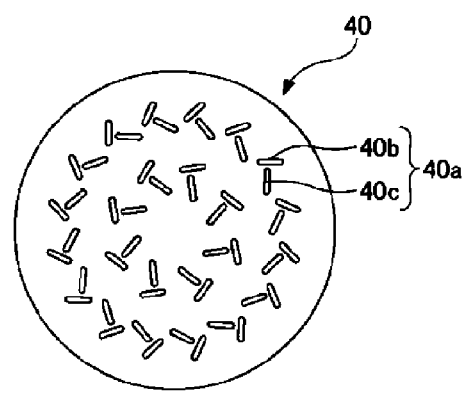
FIG. 2 is a plan view illustrating an example of a slot plate according to the embodiment.

The slot plate 40 is a substantially disc-shaped metal plate including a plurality of slot pairs formed therein. The antenna 14 is, for example, a radial line slot antenna. FIG. 2 is a plan view illustrating an example of the slot plate 40. For example, as illustrated in FIG. 2, the slot plate 40 includes a plurality of slot pairs 40a formed therein. The plurality of slot pairs 40a are provided diametrically at a predetermined interval, and also, circumferentially at a predetermined interval. Each of the plurality of slot pairs 40a includes two slot holes 40b and 40c. Each of the slot holes 40b and 40c has an elongated shape. The slot hole 40b and the slot hole 40c extend such that the axes in the longitudinal direction intersect with each other or are orthogonal to each other.

The description will be continued by returning to FIG. 1. The microwaves generated by the microwave generator 28 are propagated to the dielectric window 38 via the coaxial waveguide 16, and is propagated from each of the slot holes 40B and 40C in the slot plate 40 to the dielectric window 18 and to be introduced into the chamber 12.

The dielectric window 18 has a substantially disc shape, and is made of, for example, quartz or alumina. The dielectric window 18 is formed immediately below the slot plate 40. The dielectric window 18 transmits the microwaves propagated from the antenna 14 and radiates the microwaves from the lower surface to the processing space S. Therefore, an electric field is generated in the processing space S immediately below the dielectric window 18, and plasma of gas in the processing space S is generated. Therefore, according to the plasma processing apparatus 10, it is possible to generate plasma by using microwaves without applying a magnetic field.

In the embodiment, a recess 18a is formed on the lower surface of the dielectric window 18. The recess 18a is annularly provided around the axis X, and has a tapered-shape. A standing wave by the microwaves propagated from the antenna 14 to the dielectric window 18 is promoted by the recess 18a. Therefore, the plasma generated by the microwaves may be efficiently generated in the processing space S.

The plasma processing apparatus 10 includes a central supply 22, a peripheral supply 24, a flow splitter FS, and a gas source GS. The central supply 22 includes a pipe 22a and an injector 22b. The pipe 22a is disposed inside the inner conductor 16b along the axis X. One end of the pipe 22a is connected to the flow splitter FS, and the other end thereof is connected to the injector 22b. The injector 22b includes a plurality of through holes extending in the axis X direction. The dielectric window 18 is provided with a space for accommodating the injector 22b, and a hole 18h that connects the space and the processing space S along the axis X. The central supply 22 supplies the processing gas supplied via the flow splitter FS to the processing space S along the axis X from above the processing space S through the pipe 22a, the plurality of through holes of the injector 22b, and the hole 18h.

The peripheral supply 24 includes an annular pipe 24a and a pipe 24b. The annular pipe 24a is provided in the chamber 12 so as to annularly expend around the axis X in the intermediate position of the processing space S in the axis X direction. A plurality of gas injection holes 24h opened to the axis X side is formed in the annular pipe 24a. The plurality of gas injection holes 24h are annularly disposed around the axis X. One end of the pipe 24b is connected to the annular pipe 24a, and the other end of the pipe 24b is connected to the flow splitter FS provided outside the chamber 12. The peripheral supply 24 supplies the processing gas toward the axis X into the processing space S via the pipe 24b, the annular pipe 24a, and the gas injection holes 24h.

The gas source GS supplies the processing gas to the central supply 22 and the peripheral supply 24 via the flow splitter FS. The gas source GS supplies a desired processing gas to the central supply 22 and the peripheral supply 24 at a desired flow rate. The flow splitter FS splits the processing gas supplied from the gas source GS into the central supply 22 and the peripheral supply 24. With this configuration, in the plasma processing apparatus 10, it is possible to spatially control, for example, the gas flow rate ratio supplied from the central supply 22 and the peripheral supply 24 to the processing space S. Individual gas sources GS may be connected to the central supply 22 and the peripheral supply 24, respectively.

Further, the plasma processing apparatus 10 includes a controller 80. The controller 80 is a computer that executes a program read from the storage device to execute a desired processing. The controller 80 outputs a control signal to the gas supply GS to control the type or the flow rate of the processing gas supplied to the flow splitter FS. Further, the controller 80 outputs a control signal to the flow splitter FS to control the flow rate of the processing gas supplied to the central supply 22 and the flow rate ratio of the processing gas supplied to the peripheral supply 24. Further, the controller 80 outputs a control signal to the microwave generator 28, the radio-frequency power source 58, and the pressure adjustor 56a to control the microwave power, the RF-bias power, and the pressure in the chamber 12.

[Gas Dependence]

In the plasma processing apparatus 10, the wafer W including a mask of a silicon-containing film on an oxide semiconductor film containing at least indium (In), gallium (Ga), and zinc (Zn) is provided and is placed on the stage 20. In the following example, the IGZO film is used as the oxide semiconductor film, and the silicon oxide film ($SiO_2$) is used as the silicon-containing film, but the present disclosure is not limited thereto. For example, the oxide semiconductor film may be an oxide semiconductor film containing In, Ga, and Zn. Further, any silicon-containing film containing Si may be used, and, for example, a silicon nitride may be used.

Example 1

In Example 1, an experiment is conducted to verify the gas dependence when the IGZO film, which is the base film, using the silicon oxide film as a hard mask. The process conditions at this time are as follows.

[Process Condition]
Pressure: 20 mTorr (2.67 Pa)
Microwave: 2.45 GHz/4000 W
RF bias: 13 MHz/100 W
Gas type: Each gas of HBr, $Cl_2$, $SF_6$
Wafer temperature: 150° C.

FIGS. 3A to 3D are drawings illustrating experimental results for each gas type when the IGZO film 110 is etched using the silicon oxide film 100 as a mask. By this etching, a pillar-shaped IGZO film 110 is formed. However, the shape generated by etching is not limited to the pillar shape, and may be a recess such as a hole or a line.

FIG. 3A illustrates an initial state before etching. The silicon oxide film 100 functions as a hard mask. First, hydrogen bromide (HBr) gas is supplied to the plasma processing apparatus 10 to generate plasma of hydrogen bromide gas, and the IGZO film 110 is etched by the plasma of hydrogen bromide gas. The result is illustrated in FIG. 3B. According to the hydrogen bromide gas, the mask selection ratio with respect to the silicon oxide film 100 is good, and the IGZO film 110 may be processed substantially vertically.

With regard to this, FIG. 3C illustrates the result of supplying chlorine ($Cl_2$) gas and etching the IGZO film 110 with plasma of the chlorine. For the chlorine gas, the mask selection ratio with respect to the silicon oxide film 100 is insufficient, and thus, the etching of the IGZO film 110 is not promoted, and the side wall of the IGZO film 110 has a tapered shape.

Further, FIG. 3D illustrates the result of supplying sulfur hexafluoride ($SF_6$) gas and etching the IGZO film 110 with plasma of the sulfur hexafluoride. For the sulfur hexafluoride gas, the silicon oxide film 100 is etched, but the IGZO film 110 is not etched.

From the above, it may be found that, when the IGZO film 110 is etched using the silicon oxide film 100 as a mask, not every gas containing a halogen element may be used. That is, when the plasma of the bromine-containing gas is used, the mask selection ratio with respect to the silicon oxide film 100 is good, and the IGZO film 110 may be processed substantially vertically. Meanwhile, for the chlorine gas, the mask selection ratio is insufficient, and thus, the etching shape is not vertical, or the etching is not proceeded at all.

Therefore, the processing gas may be a gas that contains neither a chlorine-containing gas nor a fluorine-containing gas. The processing gas may be an iodine (I)-containing gas instead of the bromine-containing gas, or may contain both a bromine-containing gas and an iodine-containing gas. That is, in the method for etching the oxide semiconductor film according to the embodiment, the processing gas is a gas containing at least one of a bromine-containing gas and an iodine-containing gas, and etches the IGZO film 110 with plasma of the processing gas.

Example 2

In Example 2, an experiment is conducted by changing the wafer temperature for the etching of IGZO film 110 with hydrogen bromide gas and chlorine gas. The process conditions at this time are as follows.
[Process Condition]
Pressure: 20 mTorr (2.67 Pa)
Microwave: 2.45 GHz/800 W
RF bias: 13 MHz/100 W
Gas type: Each gas of HBr, $Cl_2$ FIGS. 4A to 4C are drawings illustrating experimental results of temperature dependence for each of hydrogen bromide gas and chlorine gas when the IGZO film 110 is etched using the silicon oxide film 100 as a mask.

Figure 4A:
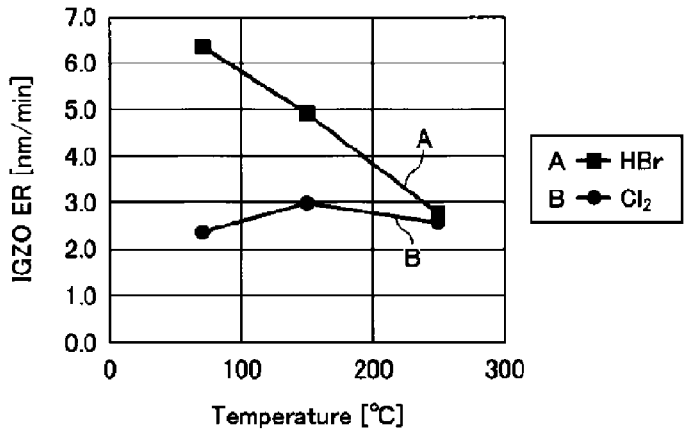
FIGS. 4A to 4C are views illustrating gas dependence in etching of the IGZO film according to the embodiment.

The horizontal axis of FIG. 4A illustrates the wafer temperature, and the vertical axis illustrates the etching rate of the IGZO film 110. The horizontal axis of FIG. 4B illustrates the wafer temperature, and the vertical axis illustrates the etching rate of the hard mask HM of the silicon oxide film 100. The horizontal axis of FIG. 4C illustrates the wafer temperature, and the vertical axis illustrates the mask selection ratio.

Figure 4B:
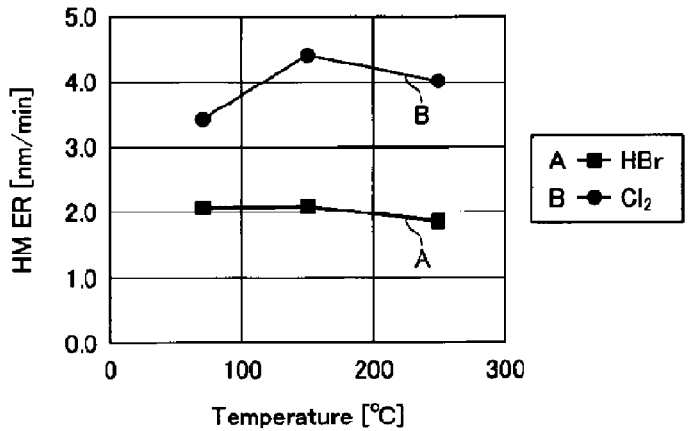
Figure 4C:
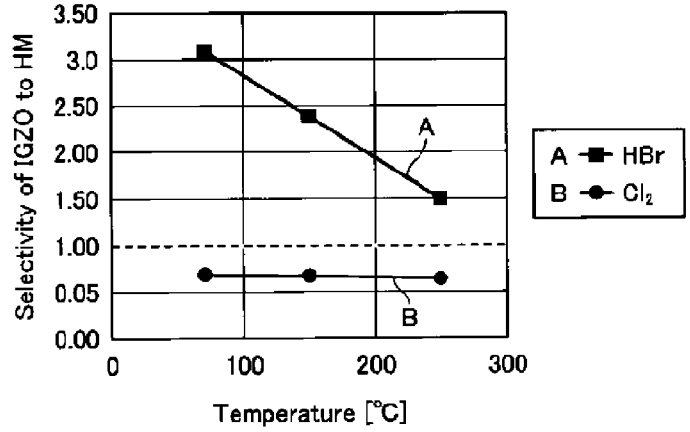

As a result of the experiment, for the hydrogen bromide gas (line A), the etching rate of the IGZO film 110 is higher than the case of the chlorine gas (line B) (FIG. 4A), and the etching rate of the hard mask of the silicon oxide film 100 is lowered (FIG. 4B). As a result, for the hydrogen bromide gas, the mask selection ratio is 1.5 times or more that case of the chlorine gas, and, particularly, is twice or more at 150° C. or lower. That is, for the hydrogen bromide gas, the IGZO film 110 may be etched without substantially changing the critical dimension (CD), while leaving the shape of the hard mask. Therefore, the vertical shape of the IGZO film 110 after etching may be ensured. Meanwhile, for the chlorine gas, the mask selection ratio is lower than "1." That is, for the chlorine gas, the mask selection ratio is not sufficiently obtained, and the side wall of the hard mask of the silicon oxide film 100 has a tapered shape, and thus, the etching shape of the IGZO film 110 has a tapered shape. From the above, it may be seen that, in recent nano-level micro processing, the mask selection ratio may be improved by etching the oxide semiconductor film using a bromide-containing gas, and, as a result, the etching shape becomes vertical, which is desirable.

Example 3

In Example 3, an experiment is conducted by changing the wafer temperature for the etching of IGZO film 110 with hydrogen bromide gas. The process conditions at this time are as follows.

Figure 5A:
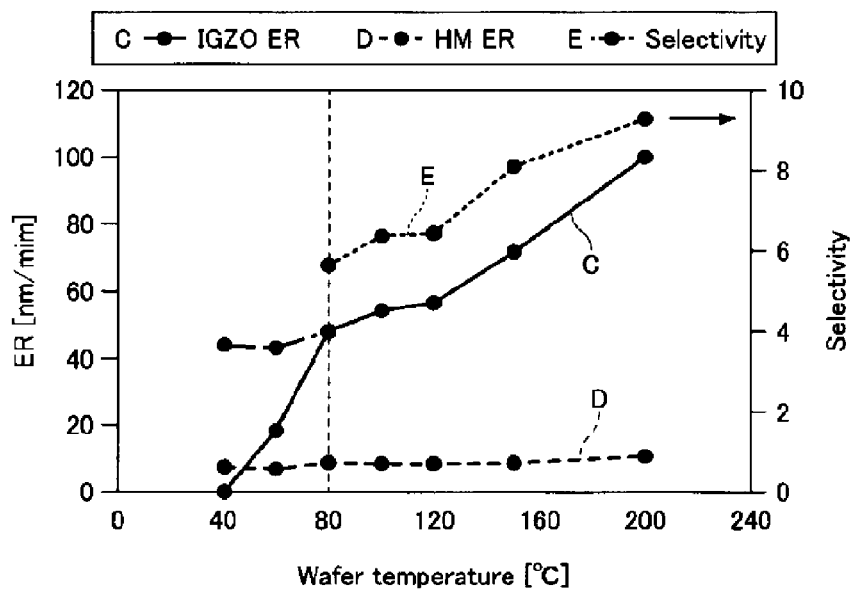
FIGS. 5A and 5B are views illustrating temperature dependence in etching of the IGZO film according to the embodiment.

[Process Condition]
Pressure: 20 mTorr (2.67 Pa)
Microwave: 2.45 GHz/4000 W
RF bias: 13 MHz/100 W
Gas type: HBr FIGS. 5A and 5B, and 6A to 6E are drawings illustrating experimental results of temperature dependence for hydrogen bromide gas when the IGZO film 110 is etched using the silicon oxide film 100 as a mask. The horizontal axis of FIG. 5A illustrates the wafer temperature, and the vertical axis illustrates the etching rate (line C) of the IGZO film 110, the etching rate (line D) of the hard mask of the silicon oxide film 100, and the mask selection ratio (line E).

As a result of the experiment, the etching rate (line C) of the IGZO film 110 when etched with the plasma of the hydrogen bromide gas increases as the wafer temperature increases in the range of 80° C. to 200° C. However, when the range of the wafer temperature is lower than 80° C., the surface of the etched IGZO film 110 is not flat, and unevenness is generated. This is illustrated by dividing the etching rate (line C) of the IGZO film 110 into two curves, that is, the slowest etching rate on the surface of the IGZO film 110 is illustrated by a solid line, and the fastest etching rate is illustrated by a dotted line.

From the above, when the wafer temperature is lower than 80° C., variation is generated in the etching, and thus, the wafer temperature may be 80° C. or higher and 200° C. or lower. When the wafer temperature is within the range, the mask selection ratio increases as the temperature increases.

Figure 5B:
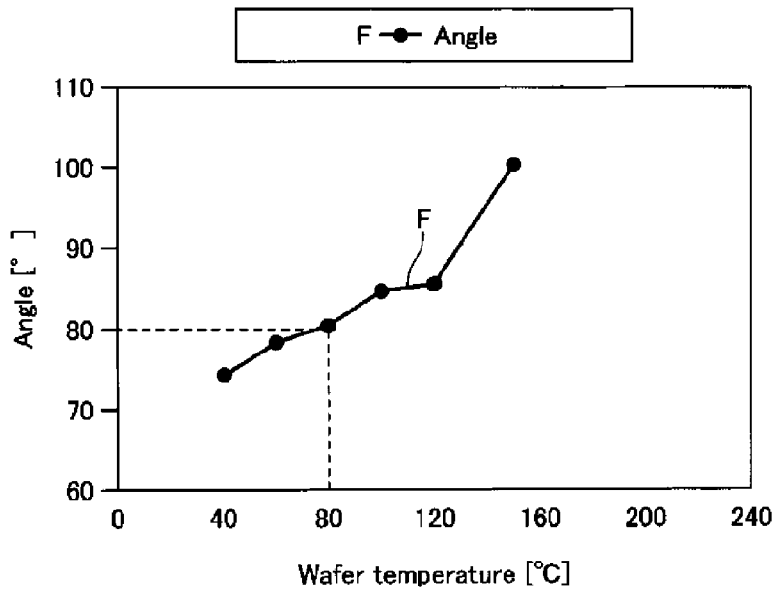

The horizontal axis of FIG. 5B illustrates the wafer temperature, and the vertical axis illustrates the etching shape by an angle. As illustrated in FIG. 6A, this angle is a measured value of an angle θ formed by the side wall of the IGZO film 110 and the horizontal direction.

When the angle θ is in the range of 80° to 100°, it may be said that the pillar shape of the IGZO film 110 is substantially vertical. Therefore, according to the angle θ (line F) illustrated in FIG. 5B, when the wafer temperature is lower than 80° C., it may be said that the angle θ is not vertical. From the viewpoint of etching shape, the wafer temperature may be 80° C. or higher and 200° C. or lower.

With respect to the wafer temperature, the cross-sectional shapes of the IGZO film 110 and the silicon oxide film 100 as a result of etching under the above process condition are illustrated in FIG. 6A when the wafer temperature is 80° C., in FIG. 6B when the wafer temperature is 100° C., in FIG. 6C when the temperature is 150° C., in FIG. 6D when the wafer temperature is 200° C., and in FIG. 6E when the wafer temperature is 250° C.

When the wafer temperature is in the range of 80° C. to 200° C., the vertical shape of the IGZO film 110 is in an acceptable range although a constricted portion is generated in the side wall in the range of 150° C. to 200° C. Meanwhile, when the wafer temperature is 250° C., a residue 120 of a reaction by-product ($SiO_2$) with the hard mask of the silicon oxide film 100 generated during the etching is generated on the side wall of the IGZO film 110.

From the experimental results, as illustrated in FIGS. 5A and 5B, when the wafer temperature is lower than 80° C., the etching rate of the IGZO film 110 is high or low, and thus, it may be seen that unevenness is generated in the IGZO film 110. Further, as illustrated in FIGS. 6A to 6E, when the wafer temperature is higher than 200° C., it may be found that the change in the CD value is not acceptable due to the constricted portion of the side wall, or the reaction by-product may adhere to the side wall of the IGZO film 110.

From the above, the wafer temperature may be controlled to 80° C. or higher and 200° C. or lower.

Example 4

In the experiment of Example 3, it is found that the wafer temperature is desirably controlled to 80° C. or higher and 200° C. or lower, but when the wafer temperature is 150° C. or higher, the side wall of the IGZO film 110 becomes constricted. As a result, a processing method that achieves a vertical shape without a constricted portion is required.

Therefore, in an experiment of Example 4, an oxygen-containing gas is added to the processing gas to control the side wall shape so as to change the constricted shape of the side wall of the IGZO film 110 to a vertical shape without a constricted portion. The added oxygen-containing gas may be at least one gas of CO, $CO_2$, $O_2$, $O_3$, COS, and $H_2O$. In the experiment of Example 4, oxygen ($O_2$) gas and carbon monoxide (CO) gas are used as the oxygen-containing gas. The process conditions at this time are as follows.
[Process Condition]
  Pressure: 20 mTorr (2.67 Pa)
  Microwave: 2.45 GHz/4000 W
  RF bias: 13 MHz/100 W
  Gas type: HBr
  Wafer temperature: 150° C.

Figure 7A:
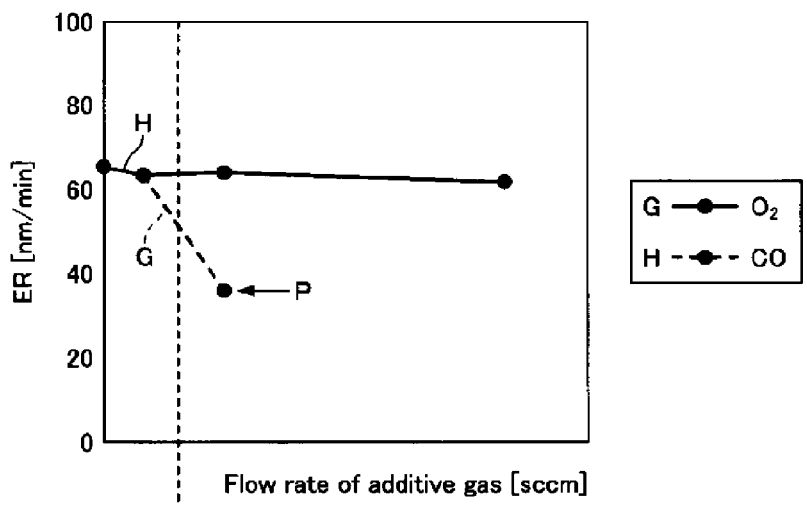
FIGS. 7A to 7C are views illustrating an example of a result of a test of adding a gas according to the embodiment.
Figure 7B:
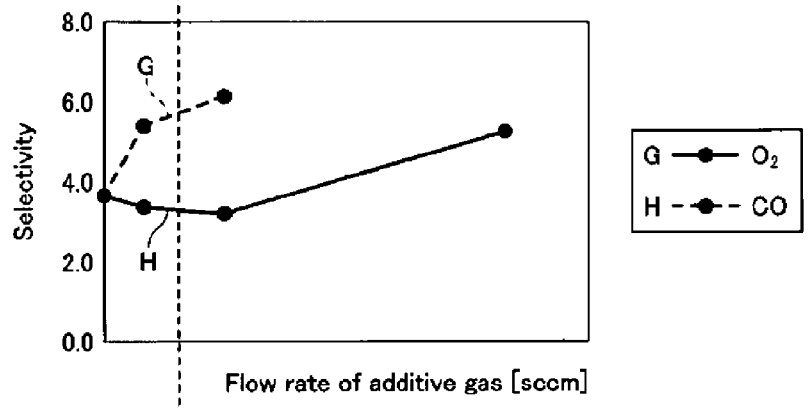
Figure 7C:
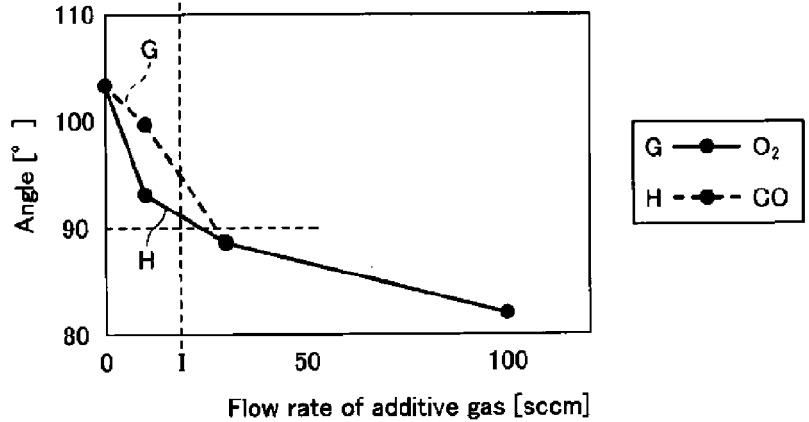

FIGS. 7A to 7C illustrate results from the experiment in which the IGZO film 110 is etched by adding an additive gas of oxygen gas or carbon monoxide gas to hydrogen bromide gas.

The horizontal axis of FIG. 7A illustrates the flow rate of the additive gas, and the vertical axis illustrates the etching rate of the IGZO film 110. The horizontal axis of FIG. 7B illustrates the flow rate of the additive gas, and the vertical axis illustrates the mask selection ratio. The horizontal axis of FIG. 7C illustrates the flow rate of the additive gas, and the vertical axis illustrates the angle θ of the side wall of the IGZO film 110.

The IGZO film 110 as a result of etching with the processing gas obtained by adding oxygen gas to hydrogen bromide gas is illustrated by line G in FIGS. 7A to 7C. The IGZO film 110 as a result of etching when carbon monoxide gas is added to hydrogen bromide gas is illustrated by line H in FIGS. 7A to 7C.

According to this, with respect to the mask selection ratio illustrated in FIG. 7B and the angle θ of the side wall of the IGZO film 110 illustrated in FIG. 7C, the line G illustrating the case where oxygen gas is added to hydrogen bromide gas illustrates the result better than the case where carbon monoxide gas is added to hydrogen bromide gas.

However, in the line G illustrating the case where oxygen gas is added to hydrogen bromide gas, in the condition of P in FIG. 7A, a rough surface is generated on the IGZO film 110. Therefore, with respect to the rough surface, the addition of carbon monoxide to hydrogen bromide gas gives the result better than the addition of oxygen gas to hydrogen bromide gas.

FIGS. 8A to 8D are views illustrating an example of gas addition of carbon monoxide gas and shape controlling of the IGZO film 110. FIG. 8A illustrates a cross-sectional shape of the silicon oxide film 100 and the IGZO film 110 when carbon monoxide gas is not added to hydrogen bromide gas.

FIG. 8B illustrates a cross-sectional shape of the silicon oxide film 100 and the IGZO film 110 when carbon monoxide gas is added to hydrogen bromide gas such that the flow rate ratio of carbon monoxide gas to hydrogen bromide gas becomes 1/100.

FIG. 8C illustrates a cross-sectional shape of the silicon oxide film 100 and the IGZO film 110 when carbon monoxide gas is added to hydrogen bromide gas such that the flow rate ratio of carbon monoxide gas to hydrogen bromide gas becomes 3/100.

FIG. 8D illustrates a cross-sectional shape of the silicon oxide film 100 and the IGZO film 110 when carbon monoxide gas is added to hydrogen bromide gas such that the flow rate ratio of carbon monoxide gas to hydrogen bromide gas becomes 1/10.

According to this, it may be found that the shape controlling of the side wall of the IGZO film 110 may be performed to be substantially vertical or close to vertical by adding carbon monoxide gas to hydrogen bromide gas. Also when oxygen gas is added to hydrogen bromide gas, the shape controlling of the side wall of the IGZO film 110 may be performed to be substantially vertical or close to vertical (see FIG. 7C).

The experiment in which water ($H_2O$) is added to hydrogen bromide gas is not conducted. When water ($H_2O$) is added to hydrogen bromide gas, due to the reduction reaction, the side wall of the IGZO film 110 may be damaged by the reduction. As a result, when an oxygen-containing gas is added to hydrogen bromide gas, it is desirable to add CO, $CO_2$, $O_2$, $O_3$, or COS rather than adding water ($H_2O$).

Example 5

Figure 9A:
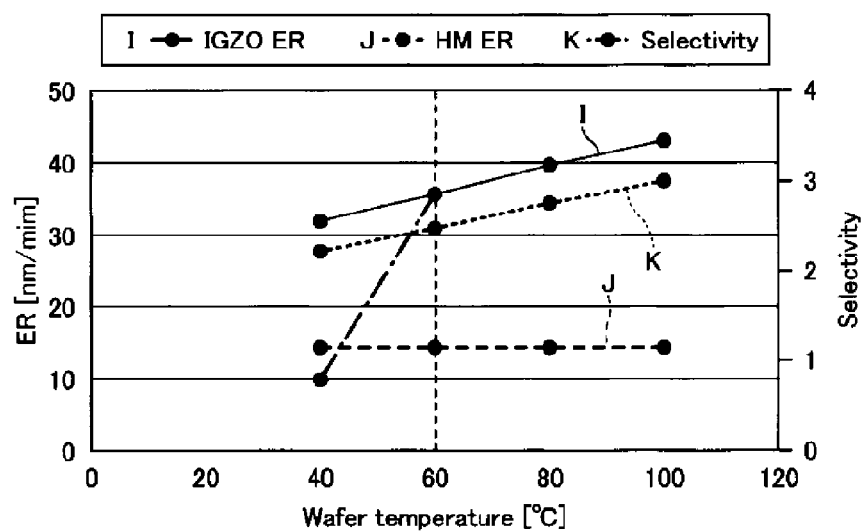
FIGS. 9A and 9B are views illustrating temperature dependence in etching of the IGZO film according to the embodiment.
Figure 9B:
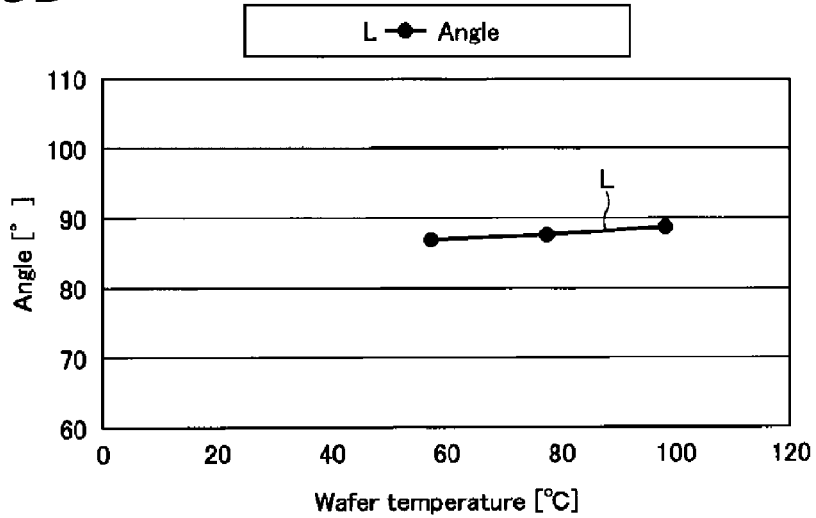

In the experiment of Example 3, when the wafer temperature is lower than 80° C., the etching rate of the IGZO film 110 is high or low, and thus, it may be seen that unevenness is generated in the IGZO film 110. However, in Example 5, the experiment in which, before etching of the IGZO film in the experiment of Example 3, break through (BT) etching is performed is conducted. The process conditions at this time are as follows.
[Process Condition]
  BT etching
  Pressure: 20 mTorr (2.67 Pa)
  Microwave: 2.45 GHz/2000 W
  RF bias: 13 MHz/100 W
  Gas type: HBr
  IGZO film etching
  Pressure: 20 mTorr (2.67 Pa)
  Microwave: 2.45 GHz/4000 W
  RF bias: 13 MHz/100 W
  Gas type: HBr FIGS. 9A and 9B are views illustrating experimental results of temperature dependence in the BT etching and the IGZO film etching. The horizontal axis of FIG. 9A illustrates the wafer temperature, and the vertical axis illustrates the etching rate (line I) of the IGZO film 110, the etching rate (line J) of the hard mask of the silicon oxide film 100, and the mask selection ratio (line K). The horizontal axis of FIG. 9B illustrates the wafer temperature, and the vertical axis illustrates the etching shape by an angle.

As a result of the experiment, similar to the experiment of Example 3, the etching rate (line I) of the IGZO film 110 decreases as the wafer temperature is lowered, and further, the surface of the etched IGZO film 110 is not flat on the lower temperature side, and unevenness is generated. However, unlike the experiment of Example 3, since the unevenness is generated in the range of the temperature lower than 60° C., the margin with respect to the temperature is widened.

As compared to the process conditions of the IGZO film etching, the microwave power is low in the etching condition of the BT etching. As a result, it is considered that, as compared to the processing of the IGZO film etching, in the processing of the BT etching, the density of the generated plasma is reduced and, as an interaction thereof, the energy of ions drawn into the wafer W is increased. Further, in the initial state before etching illustrated in FIG. 3A, an altered layer is formed on a part of the surface of the IGZO film 110 due to the residue when the silicon oxide film 100, which is a hard mask, is formed by etching processing or the fluorination of the IGZO film 110, and the recrystallization or oxidation of the IGZO film 110 by, for example, atmospheric exposure, and it is considered that they cause unevenness under the low temperature condition. By inserting the BT etching before the IGZO film etching, the energy of ions drawn into the wafer W is increased, and thus, the altered layer formed in the initial state may be removed by the stronger physical sputtering effect. Therefore, it is thought that the unevenness generation in the IGZO film etching is improved in Example 5, and thus, the unevenness is not generated on the surface of the IGZO film 110 when the wafer temperature is 60° C. or higher.

Further, according to the angle θ (line L) illustrated in FIG. 9B, the etching shape of the IGZO film is substantially 900 at a temperature of 60° C. or higher, and the angle θ is in the range of 80° to 100° even when the wafer temperature is 60° C., and thus, it may be said that the pillar shape of the IGZO film 110 is substantially vertical.

However, as compared with the experimental results of Example 3, the etching rate (line I) of the IGZO film 110 is decreased, and the etching rate (line J) of the hard mask of the silicon oxide film 100 is increased. Further, the mask selection ratio (line K) is decreased. All of them tend to deteriorate. When the above tendencies are acceptable, it may be said that the wafer temperature in the IGZO film etching may be controlled to 60° C. or higher and 200° C. or lower by inserting the BT etching step.

In Example 5, a lower microwave power is used as the BT etching, but the present disclosure is not limited to this as long as the physical sputtering effect is obtained by increasing the ion energy drawn into the wafer W. For example, the RF bias power may be increased, a rare gas such as argon may be added to the gas types, or only the rare gas may be used instead of HBr.

Further, when the process conditions of the BT etching include HBr gas, the etching of the IGZO film 110 is also promoted, and thus, the BT etching may be considered a part of the IGZO film etching.

Further, in the initial state before etching, when an altered layer is not formed on a part of the surface of the IGZO film 110, the BT etching is unnecessary. In this case, it is suggested that, when the wafer temperature is 60° C. or higher, the pillar shape of the IGZO film 110, which is substantially vertical, is obtained without causing unevenness.

[Method for Etching Oxide Semiconductor Film]

Figure 10:
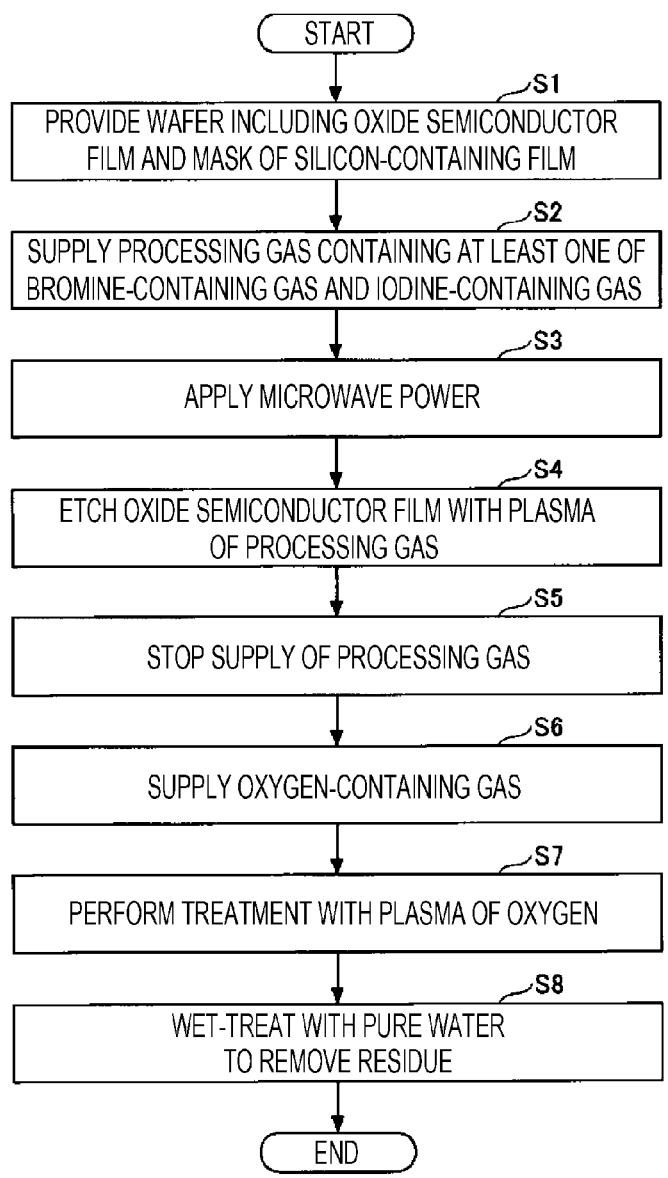
FIG. 10 is a flowchart illustrating a method for etching an oxide semiconductor film according to the embodiment.

Lastly, as an example of a method for etching an oxide semiconductor film, a method for etching the oxide semiconductor film according to the embodiment will be described with reference to FIG. 10. FIG. 10 is a flowchart illustrating a method for etching an oxide semiconductor film according to the embodiment. Here, the etching method in FIG. 10 will be described using the example executed by the controller 80 of the plasma processing apparatus in FIG. 1.

When the processing is started, the controller 80 places the wafer W including the oxide semiconductor film, and the silicon-containing film as a mask thereon on the stage 20 to provide the wafer W (step S1). Next, the controller 80 supplies the processing gas containing at least one of the bromine-containing gas and the iodine-containing gas (step S2). Next, the controller 80 applies the microwave power (step S3). At this time, the controller 80 may apply the RF bias power.

Next, the controller 80 generates plasma of the processing gas, and etches the oxide semiconductor film with the plasma (step S4). Next, the controller 80 stops the supply of the processing gas when the etching is completed (step S5). Next, the controller 80 applies an oxygen-containing gas (step S6). Next, the controller 80 performs treatment on the surface of the wafer W with plasma of oxygen gas to reduce residual bromine that may cause corrosion in a subsequent processing (step S7). Next, the controller 80 cleans (wet treatment) the wafer W with pure water to remove the water-soluble residual bromide adhering to the wafer W (step S8), and ends the processing.

According to the method for etching the oxide semiconductor film described above, the mask selection ratio in the etching of the oxide semiconductor film may be improved. Therefore, the mask may maintain the vertical shape, and thus, the etching shape of the oxide semiconductor film may be formed vertically.

Further, by adding the oxygen-containing gas to the processing gas containing at least one of the bromine-containing gas and the iodine-containing gas, the constricted portion of the side wall of the oxide semiconductor film generated according to the wafer temperature is eliminated, and the shape of the oxide semiconductor film may be controlled substantially vertically.

Further, since hydrogen bromide gas is used as the processing gas, when the wafer W is exposed to the atmosphere after etching, hydrogen bromide is corrosive, and thus, corrosion occurs on the oxide semiconductor film by the reaction between the mixture of bromine and the components of the oxide semiconductor film and the moisture contained in the atmosphere. Therefore, in order to prevent the corrosion of the oxide semiconductor film, the oxide semiconductor film is wet-treated with pure water in the subsequent processing of the etching. Therefore, the etched surface of the oxide semiconductor film may be maintained in a good state.

The plasma processing apparatus of the present disclosure may be applied to any type of the apparatus of an atomic layer deposition (ALD) apparatus, a capacitively coupled plasma (CCP), an inductively coupled plasma (ICP), a radial line slot antenna (RLSA), an electron cyclotron resonance plasma (ECR), and a helicon wave plasma (HWP).

The method for etching the oxide semiconductor film used in the plasma processing apparatus of the present disclosure may be used in a case where the performance of the semiconductor chip is improved by forming a transistor using the oxide semiconductor film in the active layer, for example, in a manufacturing processing of a back-end. In the manufacturing processing of the back-end, it is necessary to form the active layer of the transistor or a wiring layer under 400° C. or lower so as not to deteriorate the characteristics of the transistor formed at the front end. Due to this limitation, in the related art, the improvement of the performance of the semiconductor chip by forming the transistor on the back-end is not implemented. A wiring layer may be formed at 400° C. or lower in the oxide semiconductor film, and, is also superior in electrical characteristics to an amorphous silicon film that may be formed at 400° C. or lower. In order to improve the performance by forming a transistor on the back-end, in addition to the film forming technology of the oxide film semiconductor, technology for microfabrication is required. The etching method according to the present disclosure is developed to meet the demand. However, the etching method is not limited to this, and may be used for various purposes such as a manufacturing processing of DRAM, a field programmable gate array (FPGA).

According to an aspect, the mask selection ratio in the etching of the oxide semiconductor film may be improved.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A method for etching an oxide semiconductor film, the method comprising:
   providing a substrate including an oxide semiconductor film disposed below a patterned silicon oxide mask, the oxide semiconductor film containing indium (In), gallium (Ga), and zinc (Zn);
   supplying a processing gas containing a bromine (Br)-containing gas or an iodine (I)-containing gas;
   break-through etching an altered layer on the oxide semiconductor film by plasma generated from a break-through gas using microwaves before or after supplying the processing gas; and
   etching the oxide semiconductor film by plasma generated from the processing gas using microwaves after break-through etching the altered layer,
   wherein a first microwave power for generating the microwaves in the break-through etching the altered layer is lower than a second microwave power for generating the microwaves in the etching the oxide semiconductor film.

2. The method according to claim 1, wherein the processing gas contains neither a chlorine-containing gas nor a fluorine-containing gas.

3. The method according to claim 2, further comprising:
   controlling a temperature of the substrate within a range of 60° C. to 200° C.

4. The method according to claim 2, further comprising:
   controlling a temperature of the substrate within a range of 80° C. to 200° C.

5. The method according to claim 4, wherein an oxygen-containing gas is added to the processing gas.

6. The method according to claim 5, wherein the oxygen-containing gas is at least one selected from the group consisting of CO gas, $CO_2$ gas, $O_2$ gas, $O_3$ gas), COS gas, and $H_2O$ gas.

7. The method according to claim 6, further comprising:
   treating the oxide semiconductor film with plasma generated from an oxygen gas after the etching; and
   cleaning the oxide semiconductor film with pure water after the treating.

8. The method according to claim 1, further comprising:
   controlling a temperature of the substrate within a range of 60° C. to 200° C.

9. The method according to claim 8, wherein, in the controlling the temperature of the substrate, the temperature is controlled within a range of 80° C. to 200° C.

10. The method according to claim 1, wherein an oxygen-containing gas is added to the processing gas.

11. The method according to claim 10, wherein the oxygen-containing gas is at least one selected from the group consisting of CO gas, $CO_2$ gas, $O_2$ gas, $O_3$ gas), COS gas, and $H_2O$ gas.

12. The method according to claim 1, further comprising:
   after the etching, treating the oxide semiconductor film with oxygen gas plasma; and
   after the treating, cleaning the oxide semiconductor film with pure water.

* * * * *